(12) United States Patent
Brandl et al.

(10) Patent No.: US 9,412,827 B2
(45) Date of Patent: Aug. 9, 2016

(54) VERTICAL SEMICONDUCTOR DEVICE HAVING SEMICONDUCTOR MESAS WITH SIDE WALLS AND A PN-JUNCTION EXTENDING BETWEEN THE SIDE WALLS

(71) Applicant: Infineon Technologies AG, Neubiberg (DE)

(72) Inventors: Peter Brandl, St. Georgen i.G. (AT); Matthias Herman Peri, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/879,851

(22) Filed: Oct. 9, 2015

(65) Prior Publication Data

US 2016/0035845 A1    Feb. 4, 2016

Related U.S. Application Data

(62) Division of application No. 14/067,065, filed on Oct. 30, 2013, now Pat. No. 9,184,281.

(51) Int. Cl.
| | | |
|---|---|---|
| *H01L 29/66* | (2006.01) | |
| *H01L 29/423* | (2006.01) | |
| *H01L 21/265* | (2006.01) | |

(Continued)

(52) U.S. Cl.
CPC ......... *H01L 29/4236* (2013.01); *H01L 21/265* (2013.01); *H01L 21/3081* (2013.01); *H01L 21/3083* (2013.01); *H01L 21/30604* (2013.01); *H01L 21/31* (2013.01); *H01L 21/324* (2013.01); *H01L 27/088* (2013.01); *H01L 29/6634* (2013.01); *H01L 29/66348* (2013.01); *H01L 29/66666* (2013.01); *H01L 29/66727* (2013.01); *H01L 29/66734* (2013.01); *H01L 29/7395* (2013.01); *H01L 29/7811* (2013.01); *H01L 29/7813* (2013.01); *H01L 29/7827* (2013.01); *H01L 29/407* (2013.01); *H01L 29/42376* (2013.01); *H01L 29/7397* (2013.01)

(58) Field of Classification Search
None
See application file for complete search history.

(56) References Cited

U.S. PATENT DOCUMENTS 6,570,218 B1    5/2003  Bol
9,136,397 B2    9/2015  Konrath et al.

(Continued)

FOREIGN PATENT DOCUMENTS

DE   102009047786 A1   1/2012
KR   20050085608 A     8/2005

(Continued)

*Primary Examiner* — Jack Chen
(74) *Attorney, Agent, or Firm* — Murphy, Bilak & Homiller, PLLC

(57) ABSTRACT

A vertical semiconductor device includes a semiconductor body having a backside and extending, in a peripheral area and in a vertical direction substantially perpendicular to the backside, from the backside to a first surface of the semiconductor body, the body including in an active area spaced apart semiconductor mesas extending, in the vertical direction, from the first surface to a main surface arranged above the first surface, in a vertical cross-section the peripheral area extending between the active area and an edge that extends between the back-side and the first surface, in the vertical cross-section each of the mesas including first and second side walls, a first pn-junction extending between the first and second side walls, and a conductive region in Ohmic contact with the mesa and extending from the main surface into the mesa. Gate electrodes are arranged between adjacent mesas and extend across the first pn-junctions.

7 Claims, 8 Drawing Sheets

(51) Int. Cl.
*H01L 21/306* (2006.01)
*H01L 21/308* (2006.01)
*H01L 21/31* (2006.01)
*H01L 21/324* (2006.01)
*H01L 27/088* (2006.01)
*H01L 29/739* (2006.01)
*H01L 29/78* (2006.01)
*H01L 29/40* (2006.01)

(56) References Cited

U.S. PATENT DOCUMENTS

| | | |
|---|---|---|
| 2005/0067630 A1 | 3/2005 | Zhao |
| 2009/0278137 A1 | 11/2009 | Sheridan et al. |
| 2011/0133212 A1 | 6/2011 | Sheridan et al. |
| 2012/0161208 A1 | 6/2012 | Veliadis |
| 2012/0313108 A1* | 12/2012 | Tsuchiya ............ H01L 29/8613 257/76 |
| 2015/0115353 A1 | 4/2015 | Zundel et al. |
| 2015/0115356 A1 | 4/2015 | Brandl et al. |
| 2016/0035845 A1* | 2/2016 | Brandl ................ H01L 21/265 257/330 |

FOREIGN PATENT DOCUMENTS

| | | |
|---|---|---|
| KR | 20100115768 A | 10/2010 |
| WO | 2010006107 A2 | 1/2010 |
| WO | 2011071973 A2 | 6/2011 |

* cited by examiner

VERTICAL SEMICONDUCTOR DEVICE HAVING SEMICONDUCTOR MESAS WITH SIDE WALLS AND A PN-JUNCTION EXTENDING BETWEEN THE SIDE WALLS

TECHNICAL FIELD

Embodiments of the present invention relate to methods for manufacturing vertical semiconductor devices, in particular vertical field-effect semiconductor devices.

BACKGROUND

Semiconductor devices, in particular field-effect controlled switching devices such as a Metal Oxide Semiconductor Field Effect Transistor (MOSFET) and an Insulated Gate Bipolar Transistor (IGBT) have been used for various applications including but not limited to use as switches in power supplies and power converters, electric cars, air-conditioners, and even stereo systems.

Particularly with regard to power applications, semiconductor devices are often optimized with respect to low on-state resistance $R_{on}$ at low chip area A, in particular a low product of $R_{on}$ times A, fast switching and/or low switching losses. Furthermore, the semiconductor devices are often to be protected against high voltage peaks that may occur during switching of e.g. inductive loads.

DMOSFETs (double-diffused metal-oxide semiconductor field effect transistors) with channel structures manufactured using a double diffusion process for forming a body region and a source region of opposite doping type are often used, in particular in power circuits operating with large currents and/or at high voltages. So far, DMOSFETs are either implemented as planar DMOSFETs, i.e. DMOSFETs with a planar gate electrode structure, and trench-DMOSFETs in which the insulated gate electrodes are formed in trenches extending into the semiconductor substrate. Planar DMOSFETs require a comparatively large chip area A at given $R_{on}$, and are thus comparatively expensive. This applies in particular to planar MOSFETs with rated breakdown voltages above 30 V. As the MOS-channels of trench MOSFETs (T-MOSFETs) are designed along the typically vertical walls of the trenches, the cell pitch of the trench-DMOSFETs can be made small resulting in a comparatively small chip area A at given $R_{on}$. However, manufacturing is typically more complex for T-MOSFETs than for planar MOSFETs. Typically, the reduced chip area of T-MOSFETs outweighs the higher processing costs. However, energy-limited products, for example in automotive applications, and/or so-called multi-chip products requiring further signal pads and wiring may not fully benefit from the reduced required chip area of the T-MOSFET-structures because a certain chip area is required for energy dissipation during commutating and/or for the signal pads and/or for further wiring. This increases the costs of the products.

For these and other reasons there is a need for the present invention.

SUMMARY

According to an embodiment of a method for producing a vertical semiconductor device, the method includes: providing a semiconductor wafer having a main surface and including a first semiconductor layer of a first conductivity type, a second semiconductor layer of a second conductivity type forming a first pn-junction with the first semiconductor layer, and a third semiconductor layer of the first conductivity type forming a second pn-junction with the second semiconductor layer and extending to a main surface of the semiconductor wafer; forming a hard mask on the main surface, the hard mask including hard mask portions which are spaced apart from each other by first openings; using the hard mask to etch deep trenches from the main surface into the first semiconductor layer so that semiconductor mesas covered at the main surface by respective ones of the hard mask portions are formed between adjacent ones of the deep trenches; filling the deep trenches and the first openings of the hard mask; and etching the hard mask to form second openings in the hard mask at the main surface of the semiconductor mesas.

According to an embodiment of a method for producing a vertical semiconductor device, the method includes: providing a wafer including a main surface, a first pn-junction substantially parallel to the main surface, and a second pn-junction substantially parallel to the main surface and arranged between the first pn-junction and the main surface; forming a first hard mask layer of a first material at the main surface; forming a second hard mask layer of a second material on the first hard mask layer; forming on the second hard mask layer a mesa mask including openings defining semiconductor mesas in the semiconductor substrate; etching the first hard mask layer and the second hard mask layer using the mesa mask to form a hard mask so that the main surface is exposed in first areas and hard mask portions are formed each of which includes a remaining portion of the second hard mask layer and a remaining portion of the first hard mask layer, the remaining portion of the first hard mask layer having, in a direction substantially parallel to the main surface, a larger extension than the remaining portion of the second hard mask layer; etching deep trenches from the first areas at least to the first pn-junction using the hard mask to form the semiconductor mesas; and etching shallow trenches from second areas of the main surface into the semiconductor mesas, the second areas of the main surface substantially corresponding to projections of the remaining portion of the second hard mask layer onto the main surface.

According to an embodiment of a vertical semiconductor device, the vertical semiconductor device includes: a semiconductor body having a backside and extending, in a peripheral area and in a vertical direction substantially perpendicular to the backside, from the backside to a first surface of the semiconductor body, a plurality of gate electrodes insulated from the semiconductor body, and a backside metallization arranged on the backside. The semiconductor body includes in an active area a plurality of spaced apart semiconductor mesas extending, in the vertical direction, from the first surface to a main surface of the semiconductor body arranged above the first surface. In a vertical cross-section, the peripheral area extends between the active area and an edge extending between the back-side and the first surface. In the vertical cross-section each of the semiconductor mesas includes a first side wall, a second side wall, a first pn-junction extending between the first side wall and the second side wall, and a conductive region in Ohmic contact with the semiconductor mesa and extending from the main surface into the semiconductor mesa. Each of the gate electrodes is arranged between a pair of adjacent semiconductor mesas and extends in the vertical direction across the first pn-junctions of the adjacent semiconductor mesas.

Those skilled in the art will recognize additional features and advantages upon reading the following detailed description, and upon viewing the accompanying drawings.

BRIEF DESCRIPTION OF THE DRAWINGS

The components in the Figures are not necessarily to scale, instead emphasis being placed upon illustrating the principles of the invention. Moreover, in the Figures, like reference numerals designate corresponding parts. In the drawings.

DETAILED DESCRIPTION

Figure 1:
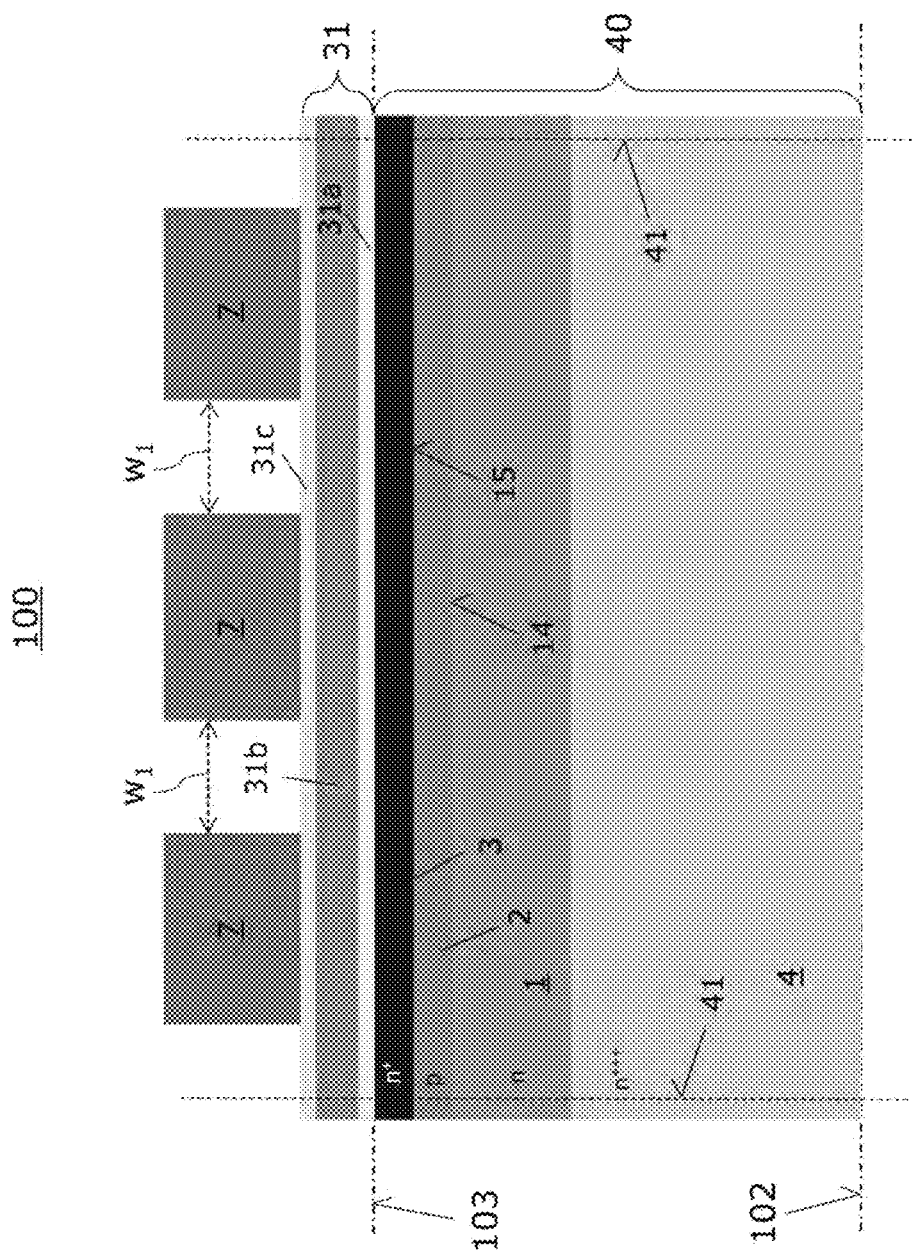
FIG. 1 to FIG. 7 illustrate vertical cross-sections through a semiconductor body during method steps of a method according to embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the Figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a main surface of a semiconductor substrate or body. This can be for instance the upper surface or front surface but also a lower or backside surface of a wafer or a die.

The term "vertical" as used in this specification intends to describe an orientation which is substantially arranged perpendicular to the main surface, i.e. parallel to the normal direction of the main surface of the semiconductor substrate or body.

The terms "above" and "below" as used in this specification intends to describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to vertical semiconductor devices such as vertical n-channel or p-channel MOSFETs or IGBTs, in particular to vertical power MOSFETs and vertical power IGBTs, and to manufacturing methods therefor.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs (field-effect transistors) having a gate insulator that is not an oxide, i.e. the term MOSFET is used in the more general term meaning of IGFET (insulated-gate field-effect transistor) and MISFET (metal-insulator-semiconductor field-effect transistor), respectively.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region.

In the context of the present specification, the term "gate electrode" intends to describe an electrode which is situated next to, and configured to form and/or control a channel region. The term "gate electrode" shall embrace an electrode or conductive region which is situated next to, and insulated from the body region by an insulating region forming a gate dielectric region and configured to form and/or control a channel region through the body region by charging to an appropriate voltage.

Typically, the gate electrode is implemented as trench-gate electrode, i.e. as a gate electrode which is arranged in a trench extending from the main surface into the semiconductor substrate or body.

Typically, the semiconductor device is a power semiconductor device having an active area with a plurality of FET-cells (field-effect-transistor-cells such as MOSFET-cells, IGBT-cells and reverse conducting IGBT-cells) for controlling a load current between two load metallization. Furthermore, the power semiconductor device may have a peripheral area with at least one edge-termination structure at least partially surrounding an active area of FET-cells when seen from above.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu, and Mo, or a metal alloy such as NiAl, but may also be made of a material with metallic or near metallic properties with respect to electric conductivity such as highly doped n-type or p-type poly-Si, TiN, an electrically conductive silicide such as $TaSi_2$, $TiSi_2$, $PtSi$, $WSi_2$, $MoSi$, or an electrically conductive carbide such as AlC, NiC, MoC, TiC, PtC, WC or the like. The metallization may also include different electrically conductive materials, for example a stack of those materials.

In the context of the present specification, the terms "in ohmic contact", in resistive electric contact" and "in resistive electric connection" intend to describe that there is an ohmic current path between respective elements or portions of a semiconductor device at least when no voltages or only low testing voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously.

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s), typically a contiguous depleted zone whereby the current flow between two electrodes or metallizations connected to the semiconductor body can be prevented.

In the context of the present specification, the term "semiconductor mesa" intends to describe one of typically several semiconductor portions or zones which extend from a common semiconductor substrate or a common semiconductor layer to or at least define a main surface of the semiconductor body or wafer and are spaced apart from each other. Typically, a semiconductor mesa is, in a vertical cross-section which is substantially orthogonal to the main surface, arranged between two adjacent trenches extending from the main surface into the semiconductor body or wafer. The trenches may be substantially vertical (vertical trenches), i.e. the side walls of the trenches and the semiconductor mesa, respectively, may, in the vertical cross-section, be substantially orthogonal to the main surface. In the vertical cross-section, the two side walls of a trench and a semiconductor mesa, respectively, may also be tapered. The terms "semiconductor mesa", "mesa regions" and "mesa" are used synonymously within this specification. In the following the two side walls of a trench and a semiconductor mesa, respectively, are also referred to as first side wall and second side wall.

Typically, the semiconductor device includes a plurality of semiconductor mesas which are spaced apart from each other by trenches and include at least two semiconductor regions of opposite conductivity type which form a pn-junction which each other. More typically, each of the semiconductor mesas includes two pn-junctions (a first and a second one) which are arranged below each other and extend, in a vertical cross-section, between or at least to the first side wall and the second side wall. The trenches may at least in the active area include a bottom wall which extends between the respective first and second walls. The trenches typically also include conductive gate electrodes which are insulated from the common substrate and the adjacent mesa regions by respective dielectric layers forming gate dielectric regions at the sidewalls. Accordingly, a FET-structure is formed which is in the following also referred to as MesaFET-structure. Likewise, a vertical semiconductor device with such a MESAFET-structure is also referred to as MesaFET, for example as MesaMOSFET and MesaIGBT, respectively.

A unit cell of the active area of a power MesaFET may, in a horizontal cross-section, include a trench-gate electrode and a respective portion of two adjoining mesas when viewed from above. In these embodiments, trench-gate electrodes, mesas and unit cells may form respective one-dimensional lattices.

Alternatively, a unit cell of an active area of a MesaFET may, in a horizontal cross-section, include a trench-gate electrode and a surrounding portion of a mesa when the trench-gate electrodes form a two-dimensional lattice, for example in the form of a checker board, when viewed from above.

The term "power semiconductor device" as used in this specification intends to describe a semiconductor device on a single chip with high voltage and/or high current switching capabilities. In other words, power semiconductor devices are intended for high current, typically in the Ampere range and/or high voltages, typically above about 30° V, more typically above about 100 V, even more typically above about 400 V.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e.g. at the edge and/or backside of the semiconductor device. The edge-termination structure may, for example, lower the field intensity around a termination region of a rectifying junction by spreading the electric field lines across the termination region.

In the following, embodiments pertaining to semiconductor devices and manufacturing methods for forming semiconductor devices are explained mainly with reference to silicon (Si) semiconductor devices having a monocrystalline Si semiconductor body. Accordingly, a semiconductor region or layer is typically a monocrystalline Si-region or Si-layer if not stated otherwise.

It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body is made of a wide band-gap material, i.e. of a semiconductor material with a band-gap of at least about two electron volts such as SiC or GaN and having a high breakdown field strength and high critical avalanche field strength, respectively, the doping of the respective semiconductor regions can be chosen higher which reduces the on-state resistance $R_{on}$.

With regard to FIG. 1 to FIG. 7, method steps of a method for forming a vertical semiconductor transistor 100 are illustrated in respective vertical cross-sections through a semiconductor body 40. For sake of clarity each of the Figures illustrates only one of a plurality of semiconductor devices 100 which are typically manufactured in parallel on wafer-level. For the same reason, only a few unit cells of the semiconductor device 100 are illustrated.

In a first step, a semiconductor substrate or wafer 40, for example a Si-wafer, extending between a main or upper surface 103 and a back surface 102 arranged opposite to the main surface 103 is provided. Typically, the wafer 40 includes a first semiconductor layer 1 of a first conductivity type (n-type), a (p-type) second semiconductor layer 2 arranged above and forming a first pn-junction 14 with the first semiconductor layer 1, and a (n-type) third semiconductor layer 3 arranged above the second semiconductor layer 2, forming a second pn-junction 15 with the second semiconductor layer 2 and extending to a main surface 103 of the semiconductor wafer 40.

In a later process step, gate electrodes are to be formed which extend in the vertical direction across the first pn-junction 14 and the second pn-junction 15 and are insulated from the semiconductor body 40 by respective gate dielectric regions so that channel regions can be formed along the insulated gate electrodes and across the first pn-junction 14 and the second pn-junction 15 during device operation. Due to forming the first pn-junction 14 and the second pn-junction 15 prior to forming any mesas and trenches, respectively, the process variation is typically reduced compared to processes in which the first and second pn-junctions (source and body regions) are formed by implantation after etching trenches to form mesas. This is due to the fact that the scattering at edges and steps during implantation is avoided when carried out prior to forming trenches and mesas, respectively. Due to the reduced process variation, the pitch may be reduced. Accordingly, chip area may be saved.

The wafer 40 may include a highly doped substrate 4 (n-doped in the exemplary embodiment) extending to the back surface 102 and arranged below the first semiconductor layer 1. In the semiconductor device 100 to be manufactured, the substrate 4 and portions thereof, respectively, typically forms a contact layer or contact portion 4 (drain region or a p-doped collector region when an IGBT is to be manufactured).

According to an embodiment, the step of providing the wafer 40 includes providing a wafer having a highly doped substrate 4, forming one or more lower doped epitaxial layers of the same or opposite conductivity type on the substrate 4, the surface of the uppermost of the epitaxial layers forming the main (horizontal) surface 103, typically unmasked implanting of p-type and n-type dopants from above, and an optional thermal annealing, for example a rapid thermal process (RTP) to form two substantially horizontally oriented pn-junction 14, 15 in the one or more epitaxial layers. The type and voltage class of the semiconductor device to be manufactured (logic level, normal level, power level) can be set by choosing the thickness and/or the doping concentrations of the epitaxial layers.

Thereafter, a stack of hard mask layer 31a, 31b, 31c may be formed on the main surface 103.

Thereafter, a mesa mask 7 may be formed on the hard mask layers 31a, 31b, 31c. The mesa mask 7 typically defines mesa regions in the wafer 40. In the exemplary embodiment illustrated in FIG. 1, three mask portions 7 of the mesa mask 7 are shown which are spaced apart from each other by openings of a first width $w_1$ and define in horizontal directions three mesa regions to be formed. This is to say the mask portions 7 cover the mesas to be formed. The first width $w_1$ may be set in accordance with a designed spacing of the mesas in an active chip area. The resulting structure 100 is illustrated in FIG. 1.

In the exemplary embodiment, the doping relations are chosen for manufacturing an n-channel MOSFET-device. In other embodiments in which a p-channel MOSFET-device is to be manufactured, the doping relations are to be reversed.

FIG. 1 typically corresponds only to a small section through the wafer 40. The dashed lines 41 indicate vertically orientated lateral edges of a semiconductor device 100 to be manufactured and sawing edges of the wafer 40, respectively.

The spacing (with of openings in the vertical cross-section) $w_3$ between two adjacent mask portions 7 of different semiconductor devices 100 to be manufactured is typically larger than first width $w_1$ to account for the area losses of sawing and/or a peripheral area arranged between the active area and the lateral edge 41 in which an edge-termination that may use a large chip area than a transistor cell of the active area may to be manufactured.

Typically, the first and second pn-junctions 14, 15 are substantially parallel to the main surface 103 and the back surface 102, respectively. Portions of the second semiconductor layer 2 and the third semiconductor layer 3 may form body regions and source regions of MOSFET-cells in the field-effect semiconductor device 100 to be manufactured.

In the exemplary embodiment illustrated in FIG. 1, the hard mask layer 31 is formed as a stack of three layers 31a, 31b, 31c, typically as an ONO-stack (oxide-nitride-oxide, $SiO_2$—$Si_3N_4$—$SiO_2$).

The first hard mask layer 31a may be formed at the main surface 103 by thermally oxidizing for a silicon wafer 40 or by deposition.

The second hard mask layer 31b and the third hard mask layer 31c may be formed by deposition on the first hard mask layer 31a and the second hard mask layer 31b, respectively.

According to an embodiment, the materials of the hard mask layers is chosen such that the second mask layer 31b is selectively etchable to the first mask layer 31a and/or the optional third mask layer 31c. This enables forming of mesas and mesa contacts with only one photo technique (to form the mesa mask 7). In so doing, processing cost may be reduced and the process variation is typically further reduced.

Thereafter, the hard mask layers 31a, 31b, 31c are etched using the mesa mask 7. Accordingly, the third semiconductor layer 3 and the wafer 40, respectively, are exposed at the main surface 103.

Figure 2:
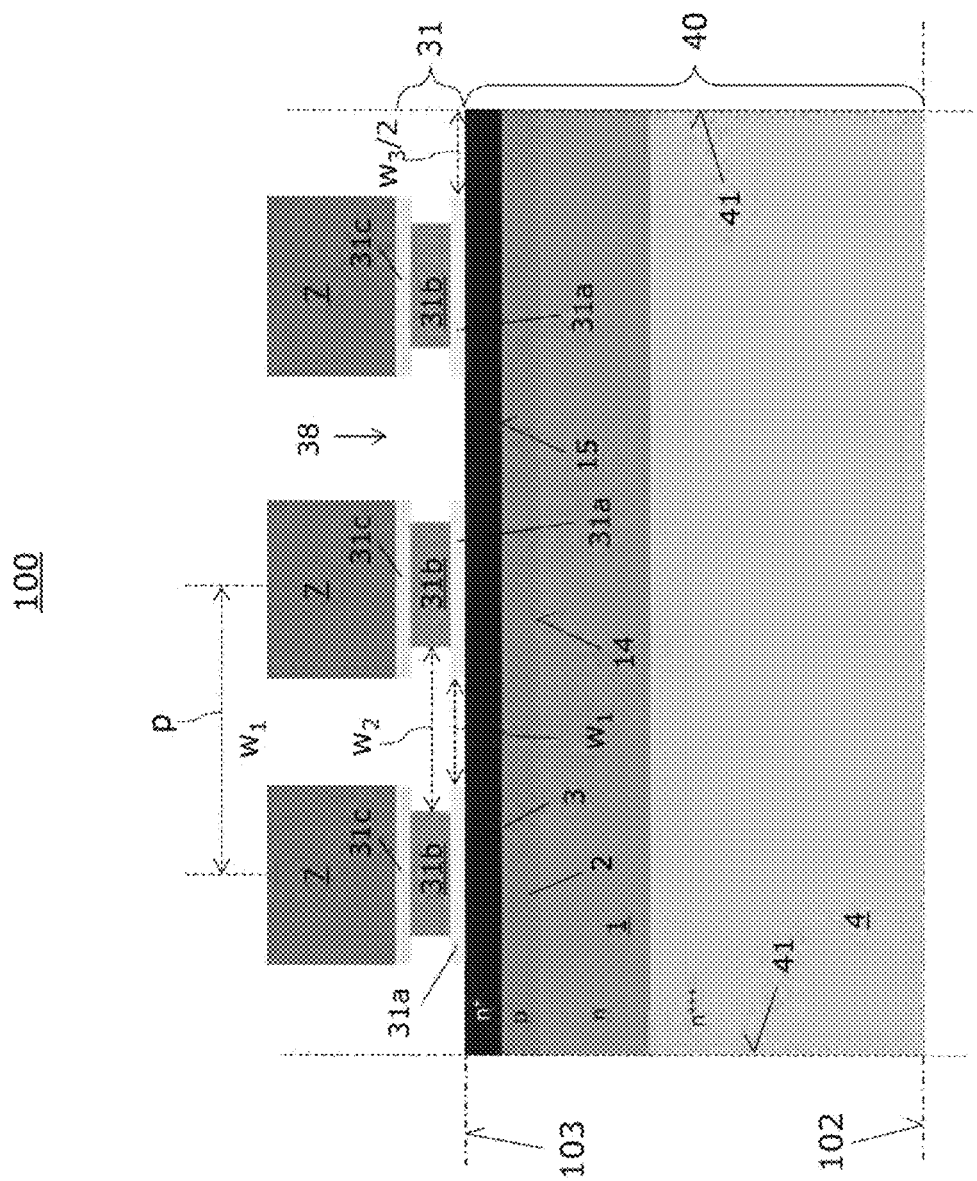

As illustrated in FIG. 2, the exposed areas (first areas) of the third semiconductor layer 3 typically substantially correspond to projections of the opening of the mesa mask 7 onto the third semiconductor layer 3 and the main surface 103, respectively.

Furthermore, etching the hard mask layers 31a, 31b, 31c to form a hard mask 31 is typically performed such that each of the hard mask portions 31 has a first part 31a, in the following also referred to as lower part 31a, and a second part 31b arranged on the lower part 31b. The first part 31a is arranged at the main surface 103 and has a horizontal extension p−w$_1$ large than a horizontal extension p−w$_2$ of the second part 31b, where p is the pitch of unit cells to be formed.

According to an embodiment, each of the hard mask portions 31 further has a third part 31c arranged on the respective second part 31b and also having a horizontal extension w$_1$ smaller than a horizontal extension p−w$_2$ of the second part 31b.

In the exemplary embodiment, the horizontal extensions of the first part 31a and the third part 31c of the hard mask portions 31 substantially match.

Forming the hard mask 31 may be achieved employing selective etchings. For example, three selective etchings may be used to structure an ONO hard mask layer 31: a first buffered oxide etching selective to nitride (HF-etch), followed by a nitride etching selective to oxide (nitride acid etch) and a subsequent second buffered oxide etching selective to nitride (HF-etch).

Due to the selective etchings, the second parts 31b are substantially centered with the first parts 31a when viewed from above. This facilitates subsequent self-adjusted forming of mesas and mesa contacts.

Typically, the hard mask 31 is formed such that the openings of the hard mask 31 in edge regions have at the main surface 103 a third width w$_3$ larger than the first width w$_1$ of the other openings 38 at the main surface 103 in an active device area.

Thereafter, the hard mask 31 is used to etch deep trenches 50, 50a from the main surface 103 into the first semiconductor layer 1. Accordingly, mesa regions 20 which are covered at the main surface 103 by respective hard mask portions 31 are formed between adjacent deep trenches 50, 50a.

Figure 3:
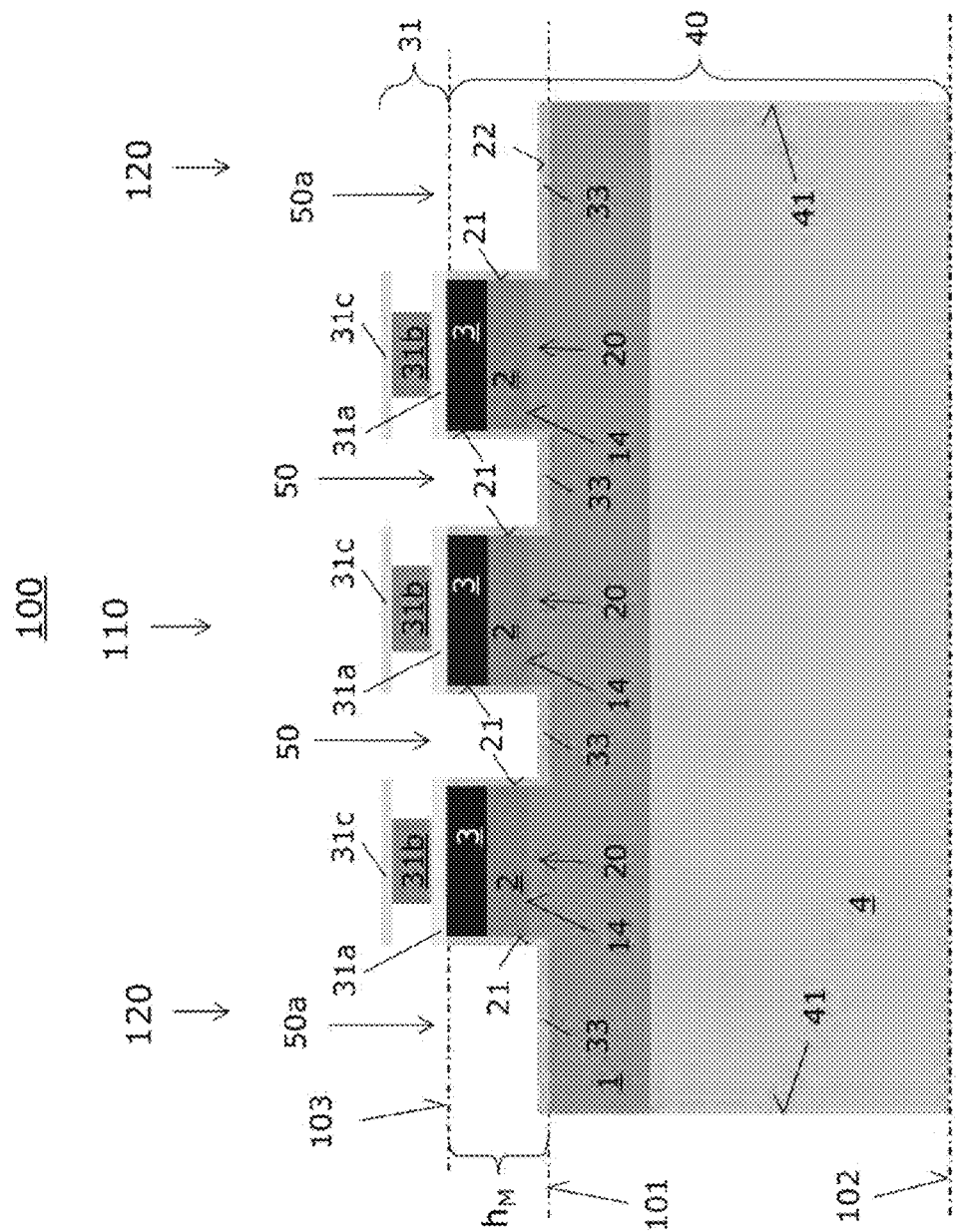

FIG. 3 illustrates the resulting semiconductor structure 100 after further forming dielectric regions 33 at sidewalls 21 and bottom walls 22 of the deep trenches 50, 50a, for example by thermal oxidation. Further, remaining portions of the first pn-junction 14 and the second pn-junction 15 extend between side walls 21 of mesas 20.

The vertical extension h$_M$ of the mesas 20 and the deep trenches 50, 50a, respectively, may, depending on voltage class, be in a range from about 500 nm to about 5 μm, more typically in a range from about 500 nm to about 2 μm.

In so doing, source regions 3 and body regions 2 may be formed in the mesa regions 20 defining an active device area 110.

Typically, upper portions of the first semiconductor layer 1 typically forming a common drift region in the semiconductor device to be manufactured extend into the mesa regions 20.

In a peripheral area 120 defined by the wider deep trenches 50a, the semiconductor body 40 only extends to a first surface 101 arranged between the back surface 102 and the main surface 103.

The peripheral area 120 may surround the active area 110 and may have a horizontal extension in a range from about 30 μm to about 50 μm, to about 100 μm or even to about 200 μm.

Figure 4:
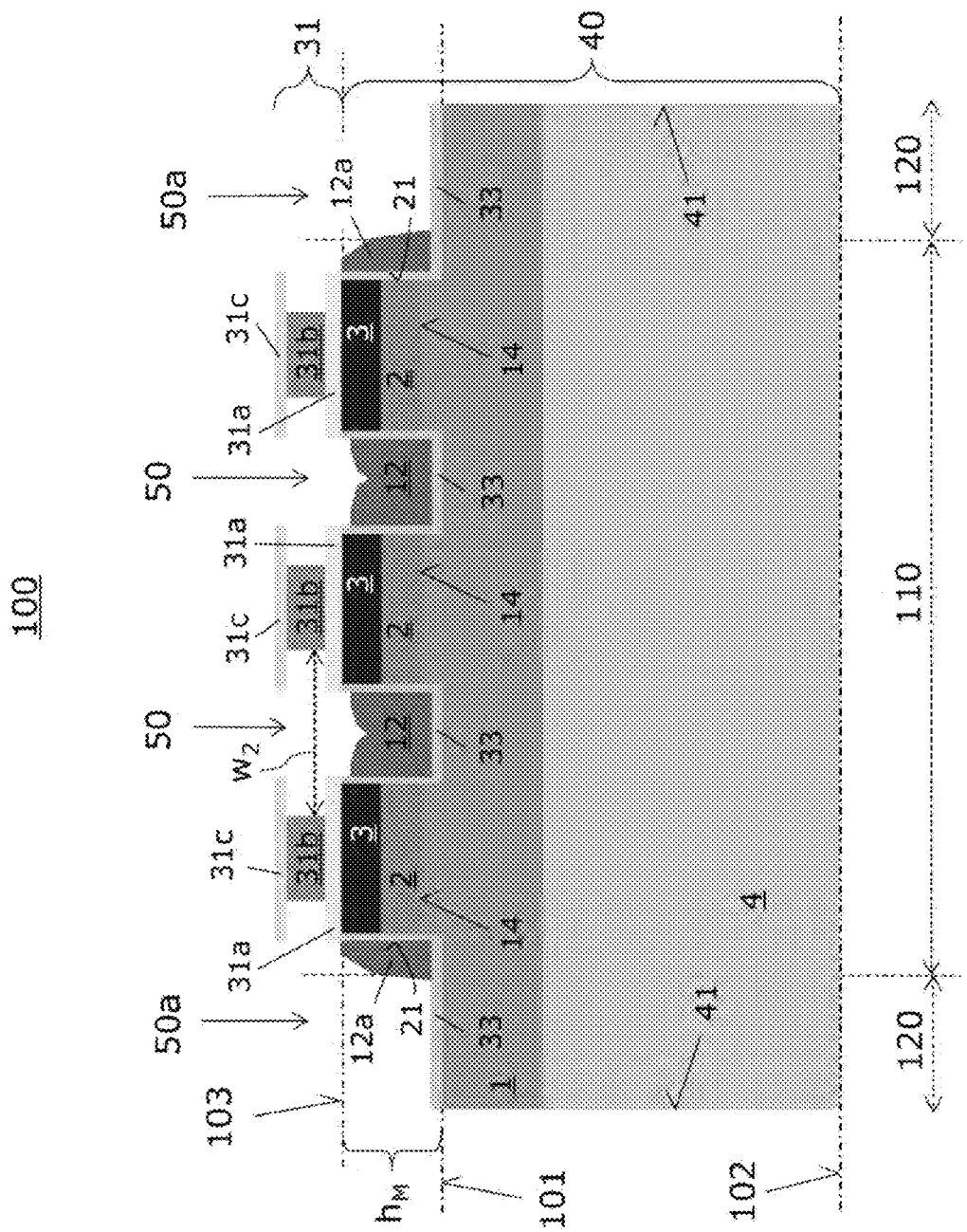

Thereafter gate electrodes 12, 12a may be formed in the deep trenches 50, 50a and on the dielectric region 33. This typically includes depositing a conductive material such doped as poly-silicon and partial back-etching. The resulting semiconductor structure 100 is illustrated in FIG. 4.

The gate electrode 12a in the peripheral area 120 may be differently shaped than the gate electrodes 12 in the active area 110. The gate electrode 12a may also act as a field electrode during a blocking mode.

Due to the lowered upper surface 101 in the peripheral area 120, no additional edge-termination structure may be required. Accordingly, manufacturing may be simplified and thus costs reduced.

Figure 5:
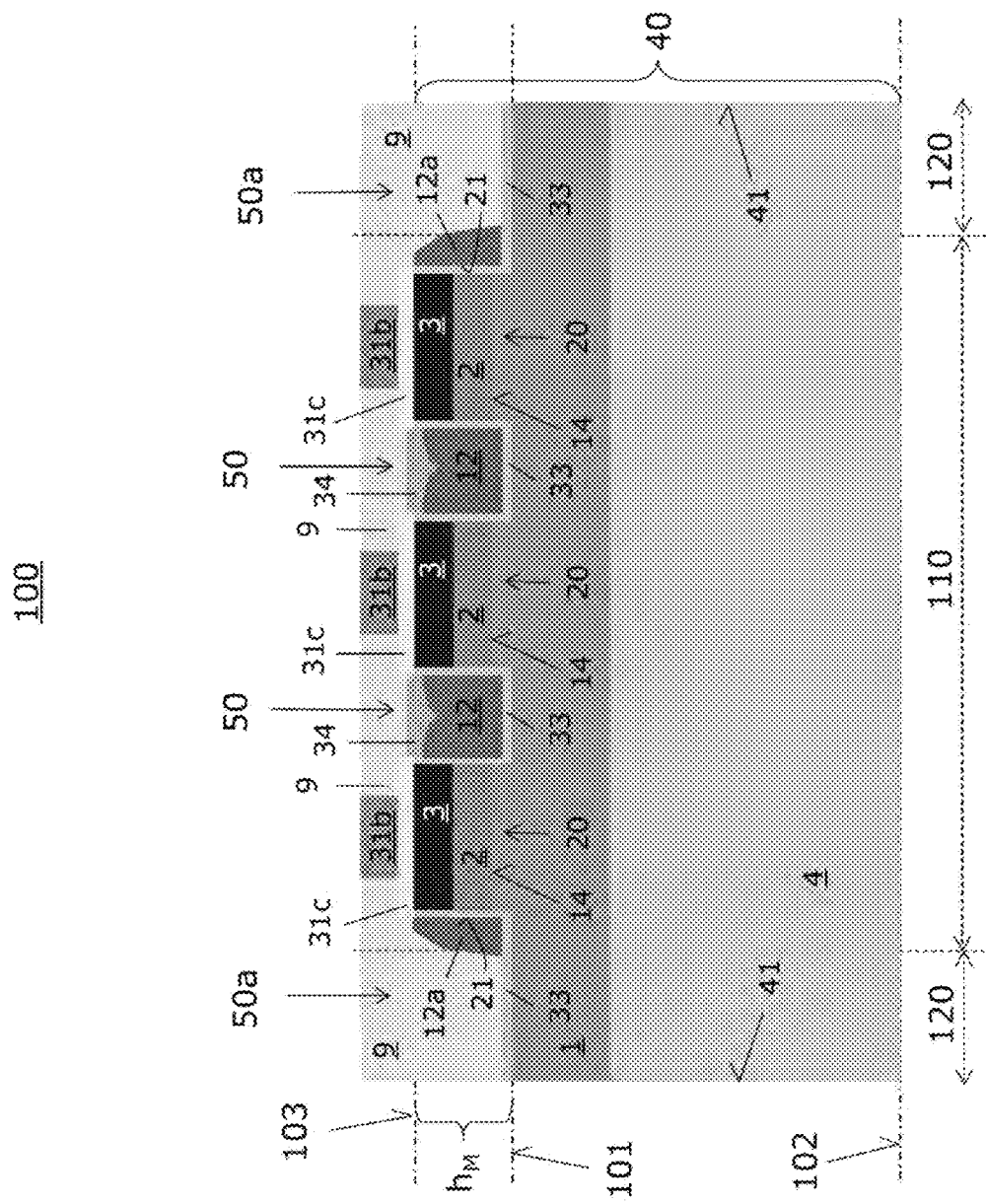

Thereafter, a dielectric material 9 such as TEOS (Tetraethylorthosilicat) selectively etchable to the material of the second mask layer 31b (second parts 31b, Si$_3$N$_4$) may be deposited and a CMP-process stopping at the second parts 31b of the hard mask 31 may be performed. The resulting semiconductor structure 100 with completely filled deep trenches 50, 50a and hard mask openings is illustrated in FIG. 5. Optionally, an oxide layer 34 may be formed on the gate electrodes 12, 12a prior to depositing the dielectric material 9, typically by thermal oxidation.

Thereafter, the remaining hard mask 31 is etched to recess the semiconductor mesas 20 at the main surface 103. This typically includes removing the second parts 31b by selective etching, and anisotropic etching the first mask layer 31.

Figure 6:
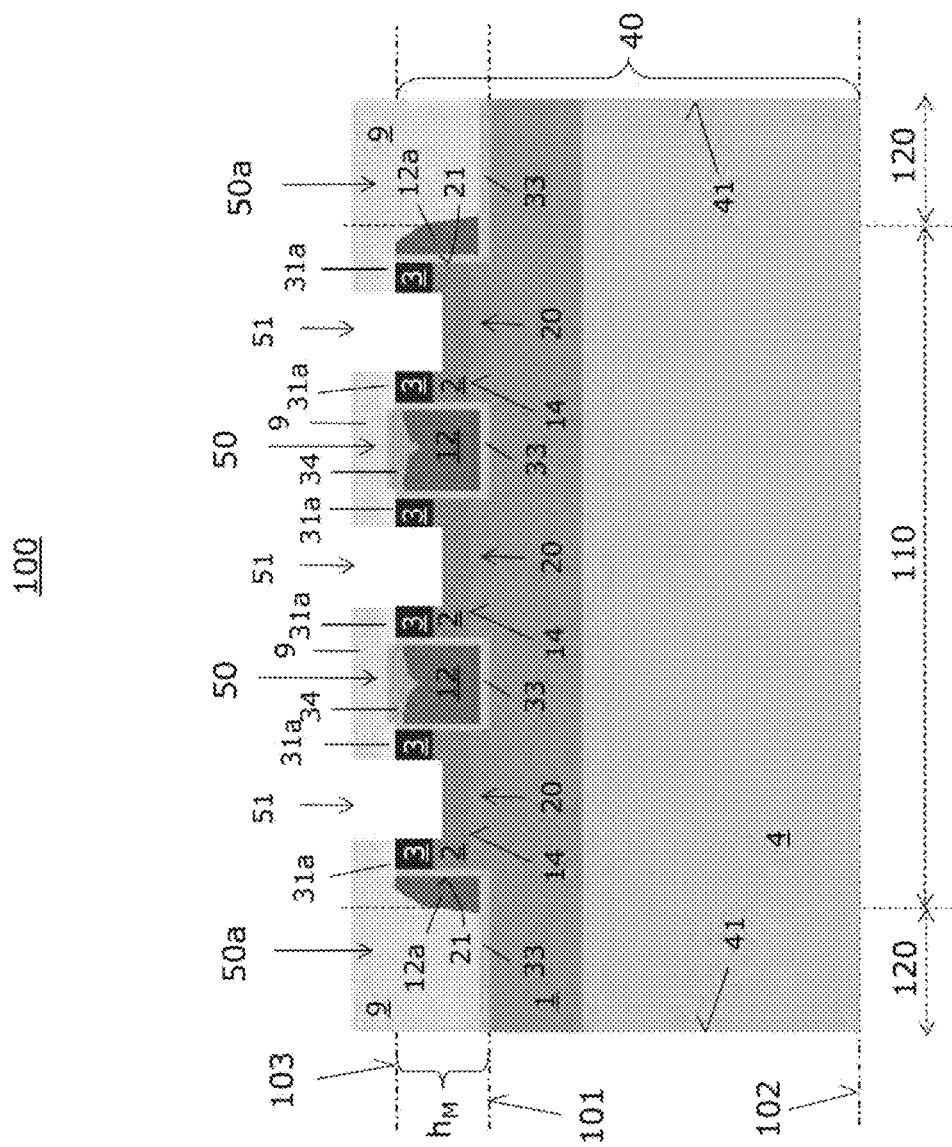

Thereafter, shallow trenches 51 may be etched from the main surface 103 to or into the semiconductor mesas 20. The resulting semiconductor structure 100 is illustrated in FIG. 6. The shallow trenches 51 typically form contact trenches and may extend through the second pn-junction 15. Typically, the shallow trenches 51 do not extend to the first pn-junction 15.

Thereafter, conductive regions or plugs 10a may be formed in the shallow trenches 51. This may include forming a silicide at side walls and/or bottom walls of the shallow trenches 51, depositing a conductive material such as poly-silicon or a metal and an optional planarization process. Typically, the plugs 10a are in contact with a first common metallization 10 (e.g. a source metallization) on the main surface 103.

In addition, a gate metallization (not shown) in contact with the gate electrodes 12, 12a and isolated from the first common metallization 10 may be formed on the main surface 103.

Thereafter, a second common metallization (backside metallization, drain metallization) 11 may be formed on the back side 102.

Figure 7:
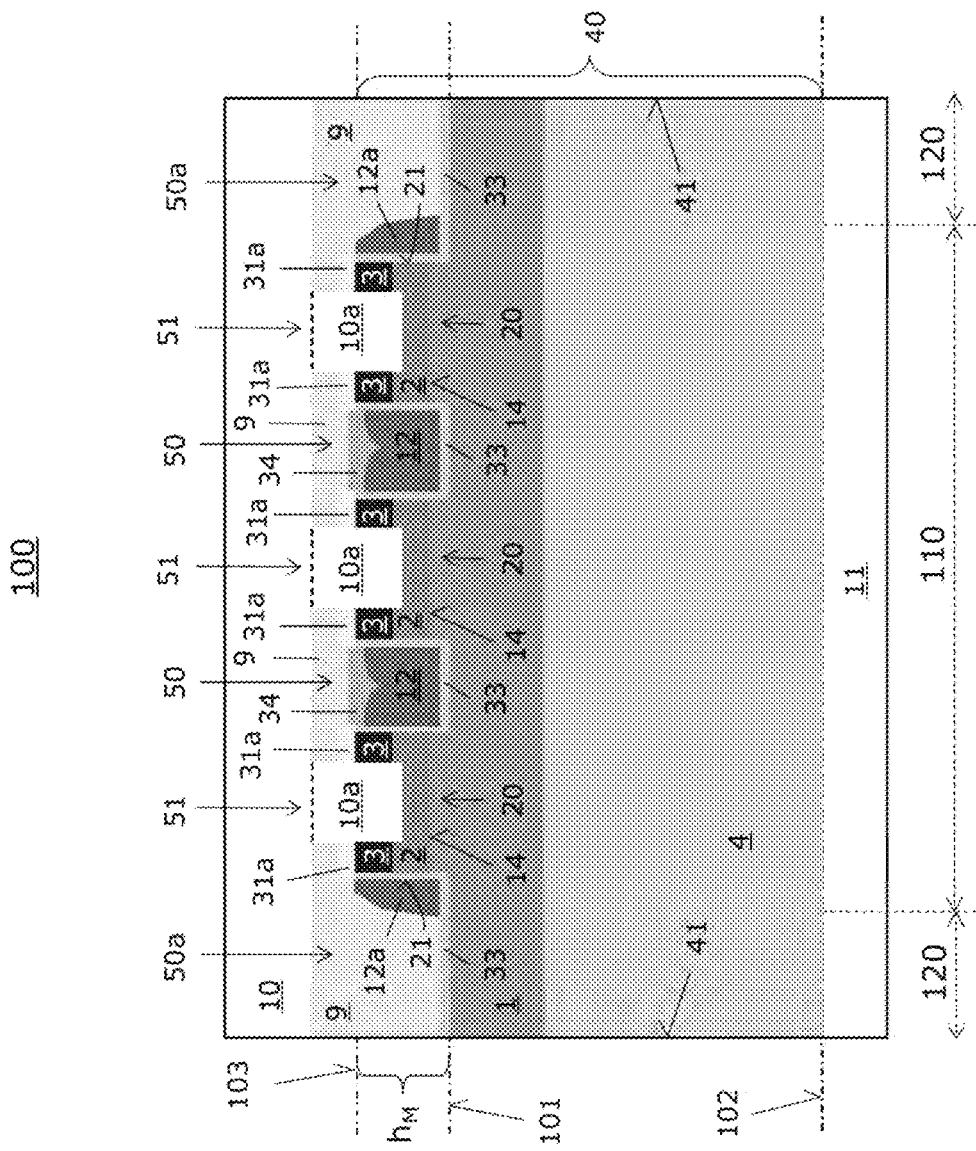

Thereafter, several devices 100 formed in the wafer 40 may be separated by sawing along vertical lines. The resulting three-terminal vertical semiconductor device 100 is illustrated in FIG. 7 and may be operated as a MOSFET:

In the exemplary embodiment, portions 31a of the hard mask 31 remain in the manufactured semiconductor device 100.

According to an embodiment, the manufactured vertical semiconductor device 100 includes a semiconductor body 40 having a backside 102 and extending, in a peripheral area 120 and in a vertical direction, from the backside 102 to a first surface 101. In an active area 110 the semiconductor body 40 includes a plurality of spaced apart semiconductor mesas 20 extending in the vertical direction from the first surface 101 to a main surface 103. In a vertical cross-section the peripheral area 120 extends between the active area 110 and an edge 41 extending between the back-side 102 and the first surface 101. Each of the semiconductor mesas 20 has in the vertical cross-section a first side wall 21, a second side wall 21, a first pn-junction 14 extending between the first side wall 21 and the second side wall 21, a second pn-junction 15 arranged above the first pn-junction 14 and extending between the first side wall 21 and the second side wall 21, and a conductive region 10a in Ohmic contact with the semiconductor mesa 20 and extending from the main surface 103 into the semiconductor mesa 20. Between adjacent mesa regions 20 a respective gate electrode 12 insulated from the semiconductor body 40 and extending in the vertical direction across the first pn-junctions 14 and the second pn-junction 15 of the adjacent mesa regions 20 is arranged. A backside metallization 11 is arranged on the backside 102.

Typically, the semiconductor device 100 further includes a gate electrode 12a which is insulated from and adjacent to an outermost semiconductor mesa 20 and extends into the peripheral area 120.

Due to the manufacturing, the conductive regions 10a are substantially centered with the respect to the semiconductor mesas 20 when viewed from above.

With regard to FIG. 8A to FIG. 8D, method steps of a method for forming a vertical semiconductor transistor 100' are illustrates in respective vertical cross-sections through a semiconductor body 40. For sake of clarity each of the Figures illustrates only one of a plurality of semiconductor transistors 100' which are typically manufactured in parallel on wafer-level. The semiconductor transistors 100' to be manufactured is similar to the semiconductor device 100 explained above with regard to FIG. 7.

In a first step, a wafer 40 having a main surface 103, a first pn-junction 14 substantially parallel to the main surface 103, and a second pn-junction 15 substantially parallel to the main surface 103 and arranged between the first pn-junction 14 and the main surface 103 is provided.

Thereafter, a first hard mask layer 31a of a first material is formed at the main surface 103, for example by thermal oxidation.

Thereafter, a second hard mask layer 31b of a second material different to the first material is formed on the first hard mask layer 31.

Thereafter, a mesa mask 7 having openings defining mesa regions 20 in the semiconductor substrate 40 is formed on the second hard mask layer 31b.

Figure 8A:
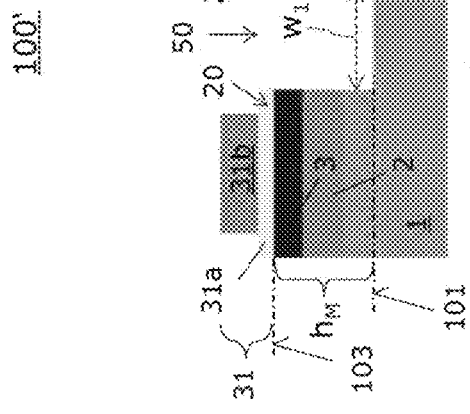
FIG. 8A to FIG. 8D illustrate vertical cross-sections through a semiconductor body during method steps of a method according to embodiments.

Thereafter, the first hard mask layer 31a and the second hard mask layer 31b are etched using the mesa mask 7 to form a hard mask 31 having hard mask portions 31 with first openings 38 exposing the semiconductor body 40 substantially at the main surface 103 in first areas. The resulting semiconductor structure 100' is illustrated in FIG. 8A.

The hard mask 31 is formed such that each of the hard mask portions 31 includes a portion 31b of the second hard mask layer 31b and a portion of the first hard mask layer 31a having, in a horizontal direction, a larger extension p–$w_1$ than the adjoining portion 31b of the second hard mask layer 31b ($w_2 > w_1$).

Figure 8B:
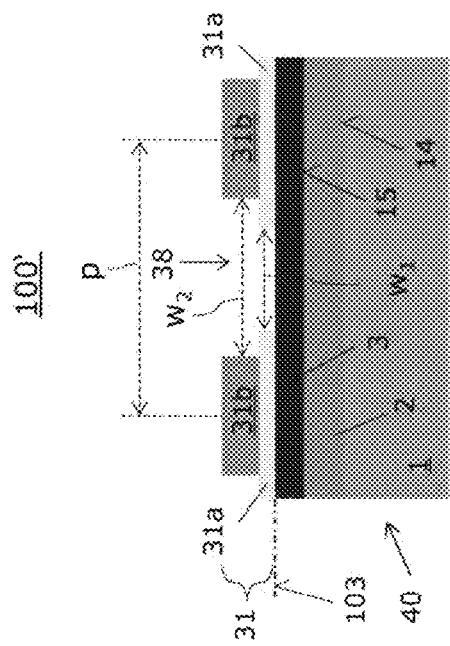

Thereafter, deep trenches 50 are etched from the first areas 38 at least to the first pn-junction 14 using the hard mask 31 to form semiconductor mesas 20. The resulting semiconductor structure 100' is illustrated in FIG. 8B.

Figure 8C:
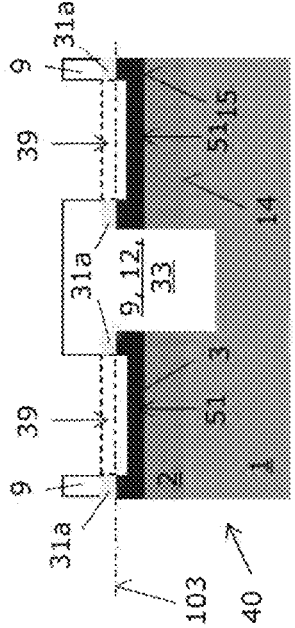

Thereafter, the deep trenches 50 and the first openings 38 of the hard mask 31 are filled. This is typically done similar as explained above with regard to FIGS. 4 and 5. The resulting semiconductor structure 100' is illustrated in FIG. 8C.

Figure 8D:
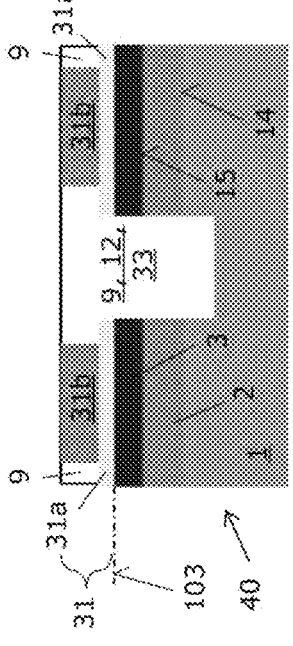

Thereafter, shallow trenches 51 are etched from second areas 39 substantially corresponding to projections of the portion 31b of the second hard mask layer 31b onto the main surface 103 into the semiconductor mesas 20. This is typically done similar as explained above with regard to FIG. 6. The resulting semiconductor structure 100' is illustrated in FIG. 8D.

Typically, the shallow trenches 51 extend vertically less deep into the wafer 40 than the deep trenches 50.

Thereafter, further manufacturing steps similar as explained above with regard to FIG. 7 may be carried out to form the field-effect transistor 100'.

The methods explained above with regard to FIGS. 1 to 8D may also be described as: providing a wafer 40 including a first semiconductor layer 1 of a first conductivity type, a second semiconductor layer 2 of a second conductivity type forming a first pn-junction 14 with the first semiconductor layer 1, and a third semiconductor layer 3 of the first conductivity type forming a second pn-junction 15 with the second semiconductor layer 2 and extending to a main surface 103 of the semiconductor substrate 40; forming a stacked hard mask layer 31a, 31b, 31c on the main surface 103; forming on the hard mask layer 31 a mesa mask 7 including, in a cross-section substantially orthogonal to the main surface 103, mask portions 7 which are spaced apart by openings and define mesa regions 20 in the semiconductor substrate 40; etching through the hard mask layer 31 and into the wafer 40 using the mesa mask 7 so that alternating mesa regions 20 and deep trenches 50, 50a are formed, the deep trenches 50, 50a extending from the main surface 103 into the first semiconductor layer 1, each of the mesa regions 20 being substantially covered with a remaining portion of the hard mask layer 31, the remaining portion comprising a second part 31b having, in the cross-section and in a direction substantially parallel to the main surface 103, a smaller minimum extension than the respective mesa region 20; and exposing the mesa regions 20 in areas defined by projections of the second parts 31a onto the main surface 103.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific FIG. may be combined with features of other Figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A vertical semiconductor device, comprising:
a semiconductor body having a backside and extending, in a peripheral area and in a vertical direction substantially perpendicular to the backside, from the backside to a first surface of the semiconductor body, the semiconductor body comprising in an active area a plurality of spaced apart semiconductor mesas extending, in the vertical direction, from the first surface to a main surface arranged above the first surface, in a vertical cross-section the peripheral area extending between the active area and an edge that extends between the back-side and the first surface, in the vertical cross-section each of the semiconductor mesas comprising a first side wall, a second side wall, a first pn-junction extending between the first side wall and the second side wall, and a conductive region in Ohmic contact with the semiconductor mesa and extending from the main surface into the semiconductor mesa;

a plurality of gate electrodes insulated from the semiconductor body, each of the gate electrodes arranged between a pair of adjacent semiconductor mesas and extending in the vertical direction across the first pn-junctions of the adjacent semiconductor mesas; and a backside metallization arranged on the backside.

2. The vertical semiconductor device of claim 1, wherein the conductive regions are substantially centered with the respect to the semiconductor mesas when viewed from above.

3. The vertical semiconductor device of claim 1, further comprising an additional gate electrode insulated from and adjacent to an outermost semiconductor mesa and extending into the peripheral area.

4. The vertical semiconductor device of claim 1, further comprising shallow trenches etched into the semiconductor mesas from the main surface so that the shallow trenches do not extend to the first pn-junction.

5. The vertical semiconductor device of claim 4, wherein the conductive regions are disposed in the shallow trenches.

6. The vertical semiconductor device of claim 1, further comprising deep trenches etched into the semiconductor body from the main surface, wherein the semiconductor mesas are disposed between adjacent ones of the deep trenches.

7. The vertical semiconductor device of claim 6, wherein the gate electrodes are disposed in the deep trenches.

* * * * *